(12) United States Patent
Matsui et al.

(10) Patent No.: US 11,757,067 B2
(45) Date of Patent: Sep. 12, 2023

(54) SYNTHETIC QUARTZ GLASS CAVITY MEMBER, SYNTHETIC QUARTZ GLASS CAVITY LID, OPTICAL DEVICE PACKAGE, AND MAKING METHODS

(71) Applicant: Shin-Etsu Chemical Co., Ltd., Tokyo (JP)

(72) Inventors: Harunobu Matsui, Joetsu (JP); Daijitsu Harada, Joetsu (JP); Daiyu Okafuji, Joetsu (JP); Hiroyuki Yamazaki, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/866,230

(22) Filed: Jul. 15, 2022

(65) Prior Publication Data

US 2022/0352427 A1 Nov. 3, 2022

Related U.S. Application Data

(62) Division of application No. 16/518,263, filed on Jul. 22, 2019, now Pat. No. 11,424,389.

(30) Foreign Application Priority Data

Jul. 23, 2018 (JP) .................................. 2018-137374

(51) Int. Cl.
*H01L 33/48* (2010.01)
*B32B 7/12* (2006.01)
(Continued)

(52) U.S. Cl.
CPC .............. *H01L 33/483* (2013.01); *B32B 7/12* (2013.01); *B32B 17/00* (2013.01); *C03C 27/10* (2013.01);
(Continued)

(58) Field of Classification Search
None
See application file for complete search history.

(56) References Cited

U.S. PATENT DOCUMENTS

2008/0273336 A1 11/2008 Tsai
2009/0295265 A1 12/2009 Tabuchi et al.
(Continued)

FOREIGN PATENT DOCUMENTS

CN 107265873 A 10/2017
DE 29 51 546 A1 7/1981
(Continued)

OTHER PUBLICATIONS

European Office Action for European Application No. 19 187 412.2, dated Oct. 28, 2021.
(Continued)

*Primary Examiner* — Benjamin P Sandvik
(74) *Attorney, Agent, or Firm* — BIRCH, STEWART, KOLASCH & BIRCH, LLP

(57) ABSTRACT

A synthetic quartz glass cavity member (1) is bonded to a substrate (6) having an optical device (7) mounted thereon such that the device may be accommodated in the cavity member. The cavity member (1) has an inside surface consisting of a top surface (2a) opposed to the device (7) and a side surface (3a). The top surface (2a) is a mirror surface and the side surface (3a) is a rough surface.

5 Claims, 4 Drawing Sheets

(51) Int. Cl.
*B32B 17/00* (2006.01)
*C03C 27/10* (2006.01)
*H01L 31/0203* (2014.01)
*H01L 31/18* (2006.01)

(52) U.S. Cl.
CPC .......... *H01L 31/0203* (2013.01); *H01L 31/18* (2013.01); *B32B 2457/00* (2013.01); *H01L 2933/0033* (2013.01)

(56) References Cited

U.S. PATENT DOCUMENTS

| | | |
|---|---|---|
| 2015/0260877 A1 | 9/2015 | Ueda et al. |
| 2016/0336716 A1 | 11/2016 | Adachi et al. |
| 2017/0044010 A1 | 2/2017 | Hirata et al. |
| 2017/0047490 A1 | 2/2017 | Leong et al. |
| 2017/0112952 A1 | 4/2017 | Kato et al. |
| 2017/0263833 A1 | 9/2017 | Chiu et al. |
| 2017/0338388 A1* | 11/2017 | Wu ....................... H01L 33/486 |
| 2020/0194638 A1* | 6/2020 | Kikuchi .................. H01L 33/52 |

FOREIGN PATENT DOCUMENTS

| | | |
|---|---|---|
| DE | 20 2007 007 342 U1 | 9/2007 |
| JP | 63-313858 A | 12/1988 |
| JP | 6-77451 A | 3/1994 |
| JP | 2007-157805 A | 6/2007 |
| JP | 2007-317719 A | 12/2007 |
| JP | 2010-166945 A | 8/2010 |
| JP | 2018-26548 A | 2/2018 |
| WO | WO 2015/152244 A1 | 10/2015 |

OTHER PUBLICATIONS

Extended European Search Report, dated Dec. 9, 2019, for European Application No. 19187412.2.

Japanese Office Action (including an English translation thereof) issued in the corresponding Japanese Patent Application No. 2019-135101 dated May 24, 2022.

* cited by examiner

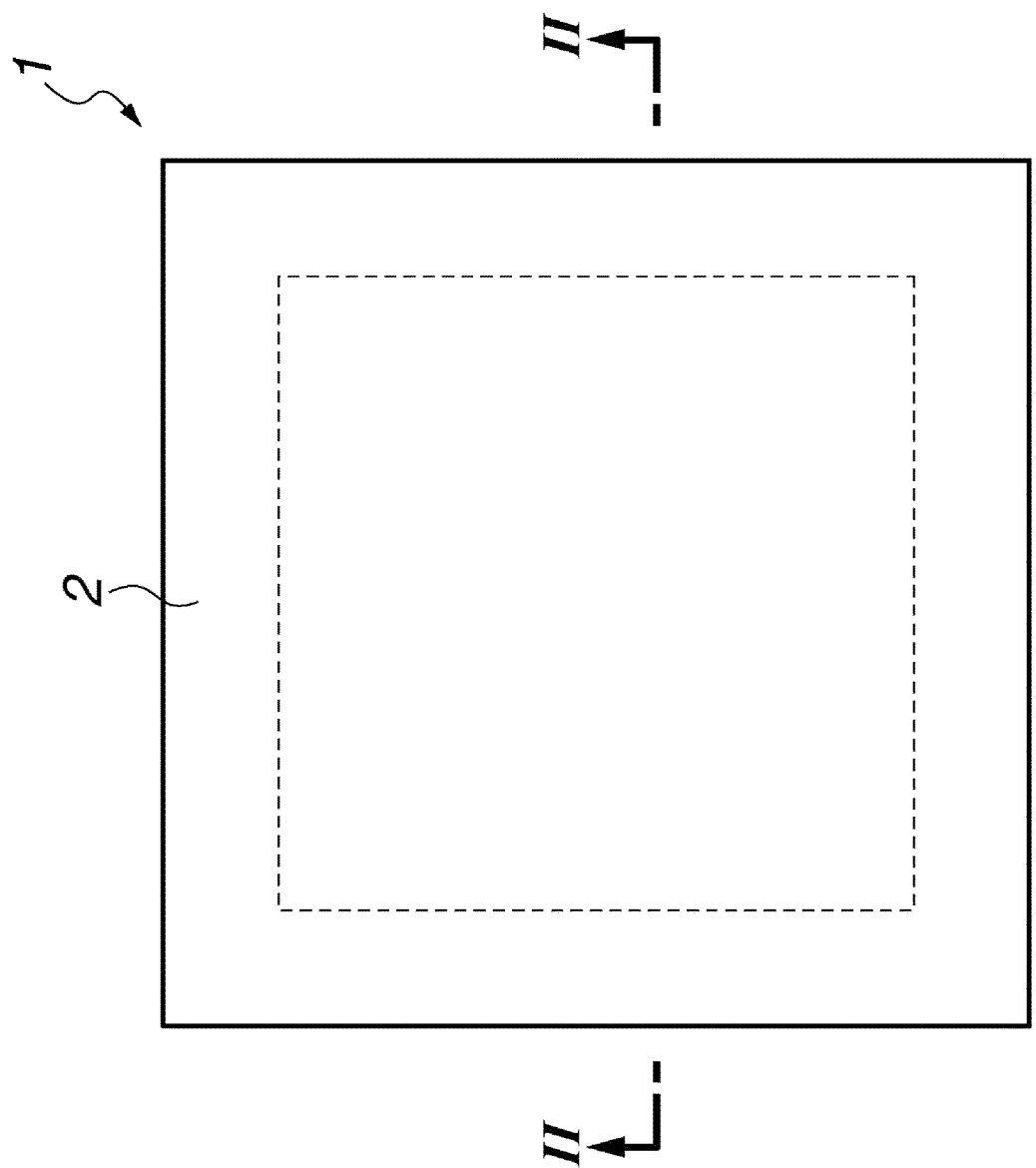

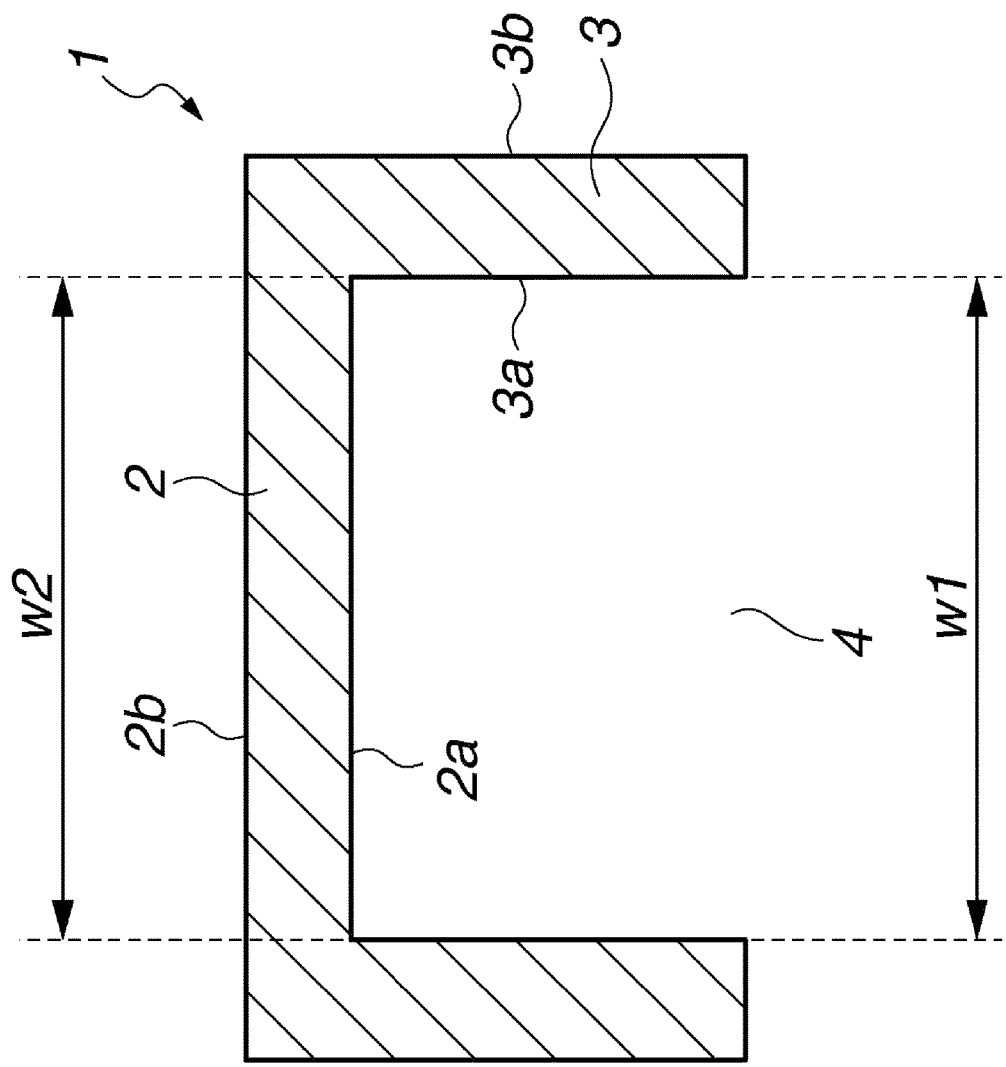

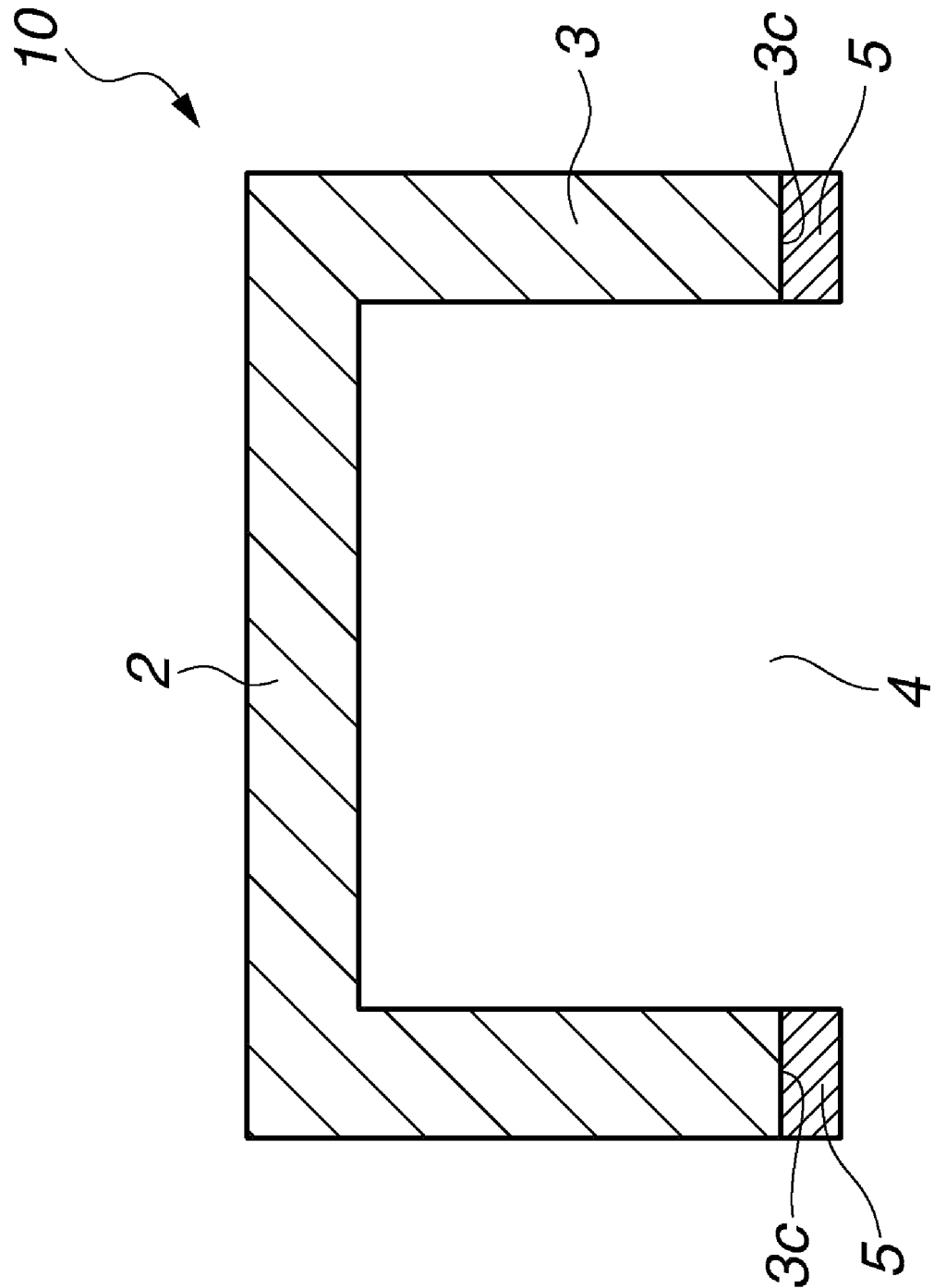

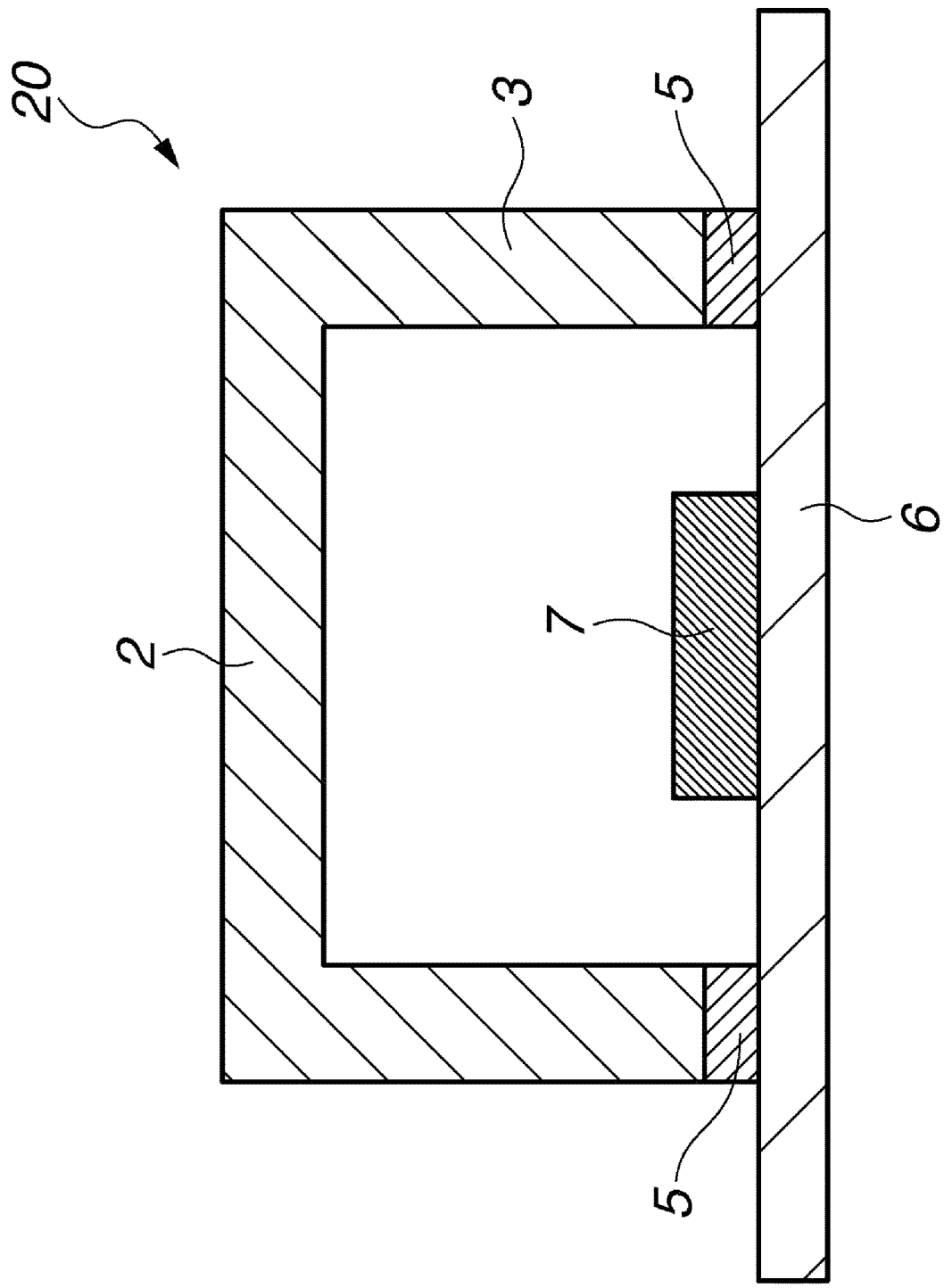

SYNTHETIC QUARTZ GLASS CAVITY MEMBER, SYNTHETIC QUARTZ GLASS CAVITY LID, OPTICAL DEVICE PACKAGE, AND MAKING METHODS

CROSS-REFERENCE TO RELATED APPLICATIONS

This application is a Divisional application of co-pending application Ser. No. 16/518,263, filed on Jul. 22, 2019, which claims the benefit under 35 U.S.C. § 119(a) to Patent Application No. 2018-137374, filed in Japan on Jul. 23, 2018, all of which are hereby expressly incorporated by reference into the present application.

TECHNICAL FIELD

This invention relates to a synthetic quartz glass cavity member, synthetic quartz glass cavity lid, optical device package, and methods for manufacturing them.

BACKGROUND ART

The use of some mercury-vapor lamps was banned. Since then, UV-LED capable of emitting light of short wavelength, especially in the UV region is regarded as an attractive replacement. Since an arbitrary wavelength is extractable from LED, there are developed LEDs capable of emitting light of a wavelength for a particular application. For example, the wavelength 265 nm in the UV region is known effective for sterilization. UV-LED capable of emitting light of wavelength 265 nm has been developed for sterilization application. Even if optical devices (UV-LED) of 265 nm are in constant supply, it is difficult to use optical devices without packaging. It is desired to package the optical devices such that the extraction of light from UV-LED may be more efficient.

For electronic devices using surface mounting compact-size packages, many members must have a hollow cavity structure. Recently, encapsulation with transparent synthetic quartz glass is required from the standpoint of heat resistance. Likewise, many light-receiving devices such as flame sensors for detecting deep UV light have a hollow cavity structure.

When optical devices such as light-emitting devices (typically LEDs) and light-receiving devices, and micro-electromechanical system (MEMS) devices are packaged, window members or molding materials are necessary. Adhesives used to bond window members include organic adhesives such as epoxy resin and acrylic resin base adhesives and glass frits. Exemplary molding materials are silicone resins.

For example, Patent Document 1 discloses to manufacture a package of hollow cavity structure for use in oscillators, gyroscopes and accelerometers. The recess of the cavity member is formed by photolithography etching or pressing. A glass member having a hollow cavity structure is bonded to a mating glass member by anodic bonding.

Patent Document 2 describes formation of a cavity structure by etching through a protective film.

CITATION LIST

Patent Document 1: JP-A 2010-186945
Patent Document 2: WO 2015/152244

DISCLOSURE OF INVENTION

Patent Document 1 has some problems. Since a cavity structure is formed by etching, there is a tendency that the opening of the cavity is rounded and so, precise control of dimensional accuracy is difficult. The wet etching method fails to perforate deep recesses. The dry etching method is successful in drilling deep recesses, but the processing time and cost are increased. Although anodic bonding is proposed as the bonding method, this method is not employed in bonding synthetic quartz glass which is an amorphous high-purity $SiO_2$ material free of metal impurities.

In Patent Document 2, a cavity structure is formed by etching through a mask. Like Patent Document 1, dimensional accuracy and recess depth are limited, and the technique is less versatile.

An object of the invention is to provide a synthetic quart glass cavity member, synthetic quartz glass cavity lid, or optical device package, which allows an optical device in a short wavelength region, especially in a wavelength region of up to 300 nm and requiring a hollow structure to exert its performance over a long term in a stable manner. Another object is to provide a method for manufacturing a synthetic quartz glass cavity member, synthetic quartz glass cavity lid, or optical device package, which enables manufacture in dimensional accuracy and solves the problem of stress during bonding between different materials.

The inventors have found that the above objects are attained by a synthetic quartz glass cavity member defined herein; that the synthetic quartz glass cavity member has improved heat resistance and UV resistance; and that a synthetic quartz glass cavity lid and an optical device package are manufactured using the synthetic quartz glass cavity member.

In one aspect, the invention provides a synthetic quartz glass cavity member adapted to be bonded to a substrate having an optical device mounted thereon such that the device may be accommodated in the cavity member, the cavity member having an inside surface consisting of a surface portion opposed to an active surface of the device and a remainder surface portion, the opposed surface portion being a mirror surface and the remainder surface portion being a rough surface.

The cavity member is preferably of an inverted recess shape in cross section having a top wall, a side wall, and a bottom opening, the inside surface of the top wall being a mirror surface and the inside surface of the side wall being a rough surface.

The top wall of the cavity member preferably has an outside surface which is a mirror surface.

A width or diameter of the bottom opening and a width or diameter of the inside surface of the top wall of the cavity member are preferably in a ratio from 0.8:1.0 to 1.2:1.0.

The rough surface of the cavity member preferably has a surface roughness (Ra) of 0.1 to 0.5 μm.

In another aspect, the invention provides a cavity lid comprising the synthetic quartz glass cavity member and an adhesive layer formed on a portion of the cavity member to be bonded to the substrate.

The adhesive layer of the cavity lid is preferably in B-stage.

The adhesive layer of the cavity lid is preferably a resin-base adhesive layer containing an epoxy resin or silicone resin or a metal-base adhesive layer containing a metal or mixture thereof.

The metal in the adhesive layer is preferably selected from the group consisting of gold, silver, copper, palladium, indium, tin and bismuth.

In a further aspect, the invention provides an optical device package comprising the cavity lid and a substrate having a light-emitting or receiving device mounted thereon.

In a still further aspect, the invention provides a method for manufacturing a synthetic quartz glass cavity member, comprising the steps of:

drilling a first synthetic quartz glass substrate at a plurality of positions to form a plurality of through-holes, laying a second synthetic quartz glass substrate on the first synthetic quartz glass substrate to form a laminate, the second synthetic quartz glass substrate having a mirror surface which is opposed to the perforated synthetic quartz glass substrate, and cutting the laminate at a position between adjacent through-holes into a plurality of discrete synthetic quartz glass cavity members.

The drilling step is preferably sand blasting or grinding by a machining center.

In a still further aspect, the invention provides a method for manufacturing a cavity lid, comprising the steps of:

manufacturing a synthetic quartz glass cavity member by the method of claim 11 or 12, and applying a resin or metal-base paste to a lower end of a side wall of the cavity member to form a resin or metal-base adhesive layer.

The adhesive layer is preferably a metal-base adhesive layer, the method further comprising the step of heating the metal-base paste to form a B-staged metal-base adhesive layer.

In a still further aspect, the invention provides a method for manufacturing an optical device package, comprising the steps of:

manufacturing a cavity lid by the above method, and bonding the cavity lid at its adhesive layer to a substrate having a light-emitting or receiving device mounted thereon such that the device may be accommodated in the cavity member.

Advantageous Effects of Invention

The invention solves the problems of degradation and breakage of a resin or metal impurity-containing glass used in prior art cavity members by short wavelength light, as well as distortion and collapse of a cavity structure by heat release from a light-emitting device and hence, solves the concomitant problem of long-term reliability. The synthetic quartz glass cavity lid is useful as an optical device packaging member requiring heat resistance and UV resistance.

BRIEF DESCRIPTION OF DRAWINGS

FIG. 1 is a plan view of a synthetic quartz glass cavity member in one embodiment of the invention.

FIG. 2 is a cross-sectional view taken along line II-II in FIG. 1.

FIG. 3 is a cross-sectional view of a synthetic quartz glass cavity lid in another embodiment of the invention.

FIG. 4 is a cross-sectional view of an optical device package using a synthetic quartz glass cavity lid in the other embodiment of the invention.

DESCRIPTION OF PREFERRED EMBODIMENTS

In the following description, like reference characters designate like or corresponding parts throughout the several views shown in the figures. The terms "top," "bottom" and the like are merely used for convenience of description, and are not limited to any one position or spatial orientation. An optical device having an active surface encompasses a light-emitting device having a light-emitting surface and a light-receiving device having a light-receiving surface. Therefore, the active surface refers to the light-emitting or receiving surface of the light-emitting or receiving device.

Synthetic Quartz Glass Cavity Member

One embodiment of the invention is a synthetic quartz glass cavity member which is adapted to be bonded to a substrate having an optical device mounted thereon such that the device may be accommodated in the cavity member. The cavity member has an inside surface consisting of a surface portion opposed to an active surface of the optical device and a remainder surface portion, the opposed surface portion is a mirror surface and the remainder surface portion is a rough surface.

FIGS. 1 and 2 illustrate one exemplary synthetic quartz glass cavity member 1. FIG. 1 is a plan view of the cavity member 1 and FIG. 2 is a cross-sectional view taken along line II-II in FIG. 1. The cavity member 1 is of an inverted recess shape or rectangular box shape in cross section having a top wall 2, a side wall 3, and a bottom opening 4, the top and side walls 2 and 3 being formed of synthetic quartz glass.

As best shown in FIG. 2, the inside surface of the cavity member 1 consists of a surface portion opposed to the active surface of the optical device, i.e., an inside surface 2a of top wall 2 and a remainder surface portion, i.e., an inside surface 3a of side wall 3, the opposed surface portion 2a is a mirror surface and the remainder surface portion 3a is a rough surface. Since the surface portion 2a opposed to the active surface of the optical device is a surface by which light is transmitted, the surface portion 2a is a mirror surface in order to increase the efficiency of light extraction. From the same standpoint, the outside surface 2b of the top wall 2 is preferably a mirror surface as well. The remainder surface portion of the cavity member inside surface other than the inside surface of the top wall, i.e., the inside surface 3a of side wall 3 is a rough surface so that light may not escape out of any surface portion other than the surface opposed to the active surface of the optical device, that is, the inside surface 3a may play the role of a pseudo-reflector for internal reflection. The outside surface 3b of the side wall 3, which is not particularly limited, may be either a rough surface or a mirror surface.

From the standpoint of increasing the extraction efficiency of light from the opposed surface, the rough surface of the cavity member wall preferably has a surface roughness (Ra) of 0.1 to 0.5 μm, more preferably 0.1 to 0.4 μm, and the mirror surface of the cavity member preferably has a surface roughness (Ra) of 0.05 to 0.4 nm, more preferably 0.05 to 0.2 nm. Notably, the surface roughness (Ra) is measured by a surface roughness measuring instrument, for example. Surfcom 480A (Tokyo Seimitsu Co., Ltd.).

Provided that the opening 4 of the cavity member 1 providing an inlet for accommodating the optical device has a width or diameter w1, and the inside surface 2a of the top wall 2 of the cavity member by which light is transmitted has a width or diameter w2, it is preferred from the standpoints of transmittance and extraction efficiency of light that a ratio of w1:w2 ranges from 0.8:1.0 to 1.2:1.0, more preferably from 0.9:1 to 1.2:1.0.

As long as the range of ratio w1:w2 is met, the cavity member 1 may be of a cylindrical shape having a closed top as well as the cross-sectional inverted recess shape (or rectangular box shape) having a bottom opening. A shape giving a lower ratio of the width or diameter w1 of the cavity opening to the width or diameter w2 of the top wall inside surface is preferred.

Synthetic Quartz Glass Cavity Lid

FIG. 3 illustrates a synthetic quartz glass cavity lid 10 in another embodiment of the invention. The lid 10 consists of the synthetic quartz glass cavity member 1 defined above and an adhesive layer 5 formed on a lower end 3c of the side wall 3 of the cavity member. For example, the cavity lid 10 is bonded at its adhesive layer 5 to a substrate 6 having an optical device 7 mounted thereon to construct an optical device package in which the optical device is accommodated in the cavity member. There is constructed an optical device package of hermetic seal (typically metal seal) in the form of the adhesive layer 5.

The adhesive layer may be a resin-base adhesive layer containing an epoxy resin or silicone resin or a metal-base adhesive layer containing a metal or a mixture of metals.

The resin-base adhesive layer is formed from a paste containing the resin and has a network or three-dimensional structure, and is bondable to a variety of materials including synthetic quartz glass substrates, ceramic substrates and metal substrates.

The metal-base adhesive layer is formed from a paste containing a metal which is preferably selected from the group consisting of gold, silver, copper, palladium, indium, tin and bismuth and mixtures thereof, more preferably one or more of silver, tin, copper and bismuth. By sintering the metal paste, a metal alloy is formed.

The resin or metal base paste may contain a dispersing medium, which is preferably an organic solvent. As the organic solvent, naphthenic hydrocarbons and long-chain alkyl alcohols of 8 to 12 carbon atoms having a giant steric structure and low polarity are preferred from the standpoint of dissolving the resin or preventing metal particles from integrating together in the metal paste. The preferred content of the dispersing medium in the resin paste is at least 10% by weight and up to 40% by weight. The preferred content of the dispersing medium in the metal paste is at least 3% by weight, more preferably at least 5% by weight and up to 20% by weight, more preferably up to 15% by weight.

The synthetic quartz glass is an amorphous material of $SiO_2$. If the quartz glass is bonded to a substrate via an adhesive layer of single metal particles having an ordered crystal structure, the adhesion at the interface between the substrate and the glass is poor. This means that when the adhesive layer of single metal particles is used as an encapsulant, it is less water resistant or less stable against external impacts, leading to breakage of an optical device package. It is believed that the metal paste for forming the metal base adhesive layer is based on metals, but does not have a crystal structure, so that a nano-level disordered atom arrangement bonds to the synthetic quartz glass surface with flexibility. This establishes a strong bond between the synthetic quartz glass and the adhesive layer, providing water resistance and resistance to external impacts. It is thus preferred that the metal particles in the metal paste for forming the metal base adhesive layer be present as nano-particles. Specifically, the metal particles should preferably have a primary particle size of at least 5 nm, more preferably at least 10 nm, and up to 80 nm, more preferably up to 60 nm, even more preferably up to 40 nm, as measured by the dynamic light scattering method. The primary particle size of metal particles can be measured by the same method as used for the metal particles in a metal paste for forming a metal film or metal compound film, for example, by a particle size analyzer ELSZ-2000ZS or light scattering spectrophotometer DLS-8000 series (Otsuka Electronics Co., Ltd.).

The thickness of the adhesive layer may be set as appropriate for a particular type of optical device package and is not particularly limited. Preferably the adhesive layer has a thickness of at least 10 μm, more preferably at least 20 μm and up to 70 μm, more preferably up to 60 μm, even more preferably up to 50 μm, as measured by a microscope, for example, VHX-6000 (Keyence Corp.).

The width of the adhesive layer is preferably less than the width of the lower end of the side wall of the cavity member, specifically 80 to 95%, more specifically 85 to 95%, even more specifically 90 to 95% of the width of the lower end of the side wall of the cavity member, in consideration of the bonding procedure in which a pressure is often applied when the cavity lid is aligned with and bonded to the substrate.

In one embodiment, the adhesive layer-forming resin or metal base paste is applied to the lower end of the side wall of the cavity member, immediately before the cavity member is bonded to the substrate. In another embodiment, the adhesive layer is previously formed on the lower end of the side wall of the cavity member to construct a cavity lid. In either embodiment, the resin or metal base paste on the lower end of the side wall of the cavity member is preferably heated to B-stage, that is, to such an extent that the paste may not flow away.

Method for Manufacturing Synthetic Quartz Glass Cavity Member

A further embodiment of the invention is a method for manufacturing a synthetic quartz glass cavity member, comprising the steps of:

drilling a synthetic quartz glass substrate at a plurality of positions to form a plurality of through-holes, laying another synthetic quartz glass substrate on the perforated synthetic quartz glass substrate to form a laminate, the other synthetic quartz glass substrate having a mirror surface which is opposed to the perforated synthetic quartz glass substrate, and cutting the laminate at a position between adjacent through-holes into a plurality of discrete synthetic quartz glass cavity members.

Glass Substrate

The starting and other synthetic quartz glass substrates are not particularly limited in shape. For example, a circular synthetic quartz glass substrate having a diameter of 4 to 8 inches (101.6 to 203.2 mm) or a rectangular synthetic quartz glass substrate having one side of 4 to 6 inches (101.6 to 152.4 mm) may be used. The starting or other synthetic quartz glass substrate preferably has a surface roughness (Ra) of 0.05 to 1.0 nm, more preferably 0.05 to 0.5 nm, in view of misalignment and strength when two substrates are joined into a laminate. The thickness of the starting or other synthetic quartz glass substrate is preferably equal to the desired depth of the cavity member.

Drilling

The step of drilling the starting synthetic quartz glass substrate at a plurality of positions to form a plurality of through-holes may be by sand blasting or by using a machining center.

The sand blasting process is, for example, by using an apparatus having a nozzle which is moved horizontally in X and Y directions across the surface of the starting glass substrate, and injecting abrasive grains along with an air jet stream against the substrate surface to form a plurality of through-holes in the substrate at a plurality of positions. The abrasive grains are preferably of aluminum oxide or silicon carbide though not limited thereto. The abrasive grains for sand blasting preferably have a size of #600 to #3000 (or average grain size 30 to 6 μm).

Specifically the drilling process may be a process of sand blasting the front or back surface of the starting substrate or a process of sand blasting both the front and back surfaces of the starting substrate, while changing the size of abrasive grains and the blasting pressure stepwise. The process of sand blasting both the front and back surfaces of the starting substrate is preferred for the purpose of minimizing or eliminating the difference in opening width or diameter between the front and back surfaces of the starting substrate due to tapering of through-holes.

In the sand blasting process, a film mask having a pattern of drillings corresponding to 90 to 95% of the desired opening width or diameter of through-holes is attached to the surface of the starting substrate (to be perforated) with an adhesive. The material of the film mask is not particularly limited as long as no residues are left on the substrate at the end of sand blasting. Brittle materials such as ceramics and glass are preferred. The adhesive used herein is typically selected from brittle fracture-susceptible or low resilient adhesives, for example, silica based adhesives, ceramic adhesives, and cement.

Sand blasting is carried out on the starting substrate through the film mask whereby the substrate in the areas not covered with the film mask is immediately ground until through-holes are formed.

After the formation of through-holes, if the ratio of the width or diameter of through-holes on the front surface to the width or diameter of through-holes on the back surface is outside the predetermined range (ratio of w1:w2 of the cavity), suitable correction is performed by etching, to minimize the difference in opening width or diameter between the front and back surfaces of the glass substrate due to tapering.

The (ground) inner surface of through-holes drilled by sand blasting is a rough surface having a surface roughness (Ra) of preferably 0.1 to 0.5 µm, more preferably 0.1 to 0.3 µm. At this point, the traverse direction, traverse speed and pneumatic pressure of the sand blasting nozzle may be adjusted by a computer control system so that the ground surface may become a rough surface having the predetermined roughness. Specifically, since the pneumatic pressure is correlated to the abrasive grains and the nozzle-substrate distance, the pneumatic pressure is not determined to a fixed value and adjusted in accordance with the removal rate and grinding depth. For example, when green silicon carbide (GC) or white alundum (WA) is used as the abrasive grains, the pneumatic pressure is preferably 0.15 to 0.30 MPa.

In the other embodiment wherein the drilling step uses a machining center, the process of machining both the front and back surfaces of the glass substrate is preferred for the purpose of minimizing the difference in opening width or diameter between the front and back surfaces of the glass substrate due to tapering of through-holes.

The machining step uses a machining center or numerically controlled boring machine equipped with a diamond wheel, rotating and traversing the diamond wheel under such machining conditions that do not cause cracking, crazing or chipping to the machined surface of the glass substrate, for thereby drilling through-holes of the predetermined size or depth. Specifically, machining is carried out by using a grinding wheel having diamond or CBN grains electroplated or metal bonded, and rotating the wheel at a spindle speed of preferably 100 to 60,000 rpm, more preferably 1,000 to 40,000 rpm and a grinding rate of preferably 1 to 10,000 mm/min, more preferably 10 to 1,000 mm/min.

Lamination of Synthetic Quartz Glass Substrates

The drilling step is followed by the step of bonding a second synthetic quartz glass substrate to the first synthetic quartz glass substrate having a plurality of through-holes to form a laminate.

The second glass substrate to be bonded to the first glass substrate has a size which is preferably the same as the first glass substrate and a thickness of preferably at least 0.2 mm, more preferably at least 0.3 mm, from the standpoint of deflection of the glass substrate. The upper limit of the thickness of the second glass substrate is not critical and is preferably up to 0.6 mm from the standpoint of extraction efficiency of light.

The surface of the second glass substrate which is bonded to the first glass substrate is a mirror surface over at least the areas which correspond to the through-holes in the drilled glass substrate. Preferably the surface of the second glass substrate which is bonded to the first glass substrate is a mirror surface. The mirror surface preferably has a surface roughness (Ra) of up to 0.3 nm, more preferably up to 0.2 nm and at least 0.05 nm. Most preferably, both the front and back surfaces of the second glass substrate are mirror surfaces.

The step of bonding the first glass substrate to the second glass substrate may include laying both the glass substrates in alignment if both the glass substrates are of the same size and bonding them together. Although there is no need to apply any load to the glass substrates, a light load of about 50 gf or less may be applied to prevent misalignment of bonding.

Once the second (undrilled) glass substrate is laid on the first (drilled) glass substrate having through-holes, the laminate is placed in an oven where it is heated preferably at 1,000 to 1,200° C. for 2 to 4 hours to bond the two glass substrates together tightly.

After bonding, if necessary, the second (undrilled) glass substrate may be polished on one surface until the thickness of the top wall of the final glass cavity member reaches the desired value.

Cutting

The lamination step is followed by the step of cutting the laminate into a plurality of discrete synthetic quartz glass cavities.

The laminate or bonded glass substrates is cut at a position between adjacent through-holes by a dicing saw, for example, into a plurality of discrete cavity members (i.e., singulation). Preferably the laminate is cut into a plurality of pieces of 1 to 5 mm squares.

With the subsequent step of forming an adhesive layer taken into account, the cut laminate is preferably forwarded to the subsequent step while the dicing tape is kept attached to the second (undrilled) glass substrate, i.e., the outside surfaces of the top walls of the glass cavity members.

Method for Manufacturing Cavity Lid

A still further embodiment of the invention is a method for manufacturing a cavity lid, comprising the step of forming an adhesive layer on the lower end of the side wall of the cavity member.

The adhesive layer may be a resin or metal-base adhesive layer. The resin or metal-base adhesive layer may be formed by furnishing a paste containing a resin and a dispersing medium or a paste containing at least one element selected from gold, silver, copper, palladium, indium, tin and bismuth and a dispersing medium, and applying the paste to the lower end of the side wall of the cavity member by dispensing, screen printing, stamping, or inkjet printing. When it is desired that the adhesive layer be formed by a single step at a high accuracy, the screen printing technique capable of applying the adhesive paste in one pass is preferred.

The adhesive layer-forming resin or metal-base paste is as previously described, and the thickness and width of the adhesive layer are also as previously described.

The metal-base paste may be converted to B-stage by heating at a temperature lower than the curing temperature. From the standpoint of heat resistance of the device to be sealed in the cavity member, the adhesive layer-forming metal-base paste is preferably cured at a temperature of 100 to 350° C., more preferably 100 to 300° C., even more preferably 150 to 300° C.

The synthetic quartz glass cavity lid thus obtained is useful in sealing a variety of optical devices. Particularly when synthetic quartz glass by which light of wavelength 280 nm or shorter is transmitted in a stable manner is used as the cavity member, the cavity lid is useful with optical devices capable of emitting or receiving light of UV-C (wavelength 240-300 nm) or DUV (wavelength 170-240 nm).

Optical Device Package and Manufacture

A still further embodiment of the invention is an optical device package comprising the cavity lid (2, 3, 5) and a substrate 6 having an optical device 7 mounted thereon as shown in FIG. 4. The cavity lid is rested on the substrate 6 and bonded thereto via the adhesive layer 5 such that the device 7 is accommodated in the cavity member.

The optical device is selected from light-emitting devices such as UV-LED, KrF excimer laser and ArF excimer laser, and light-receiving devices such as flame sensors.

The substrate having an optical device mounted thereon is typically selected from alumina based ceramic substrates, aluminum nitride based ceramic substrates, and copper plates. Also included are the foregoing substrates having a metal layer of gold, silver, platinum or chromium or a metal compound layer of chromium nitride, titanium oxide or the like on their surfaces. Separately, when a reflecting material is coated on the inside surface of the side wall of the cavity member, the coating may function as a mirror.

The optical device package is manufactured by resting the cavity lid on a substrate having an optical device mounted thereon, adjusting them in alignment, bringing the adhesive layer in contact with the substrate, and bonding the cavity lid to the substrate to construct a package in which the optical device is accommodated in the cavity member.

Preferably, the cavity lid and the substrate having an optical device mounted thereon are heated in the stacked state, if necessary. From the standpoint of heat resistance of the optical device, the temperature of heat treatment or curing temperature is preferably 150 to 330° C., and the time of heat treatment is preferably 1 to 60 minutes, more preferably 1 to 30 minutes. Also preferably, pressure is simultaneously applied. The atmosphere for bonding or heat bonding is air atmosphere or inert gas atmosphere such as nitrogen gas. When the cavity lid has an adhesive layer of metal base paste in B-stage, heating allows the metal base adhesive layer to be compressed so that metal particles therein are closely bound, establishing a more hermetic seal.

EXAMPLE

Examples of the invention are given below by way of illustration and not by way of limitation.

Example 1

A synthetic quartz glass wafer or substrate (diameter 101.6 mm, thickness 0.4 mm) having front and back surfaces which were mirror surfaces (Ra=0.3 nm) was furnished as the first substrate. A film mask having a pattern including apertures of 0.8 mm squares was attached to the front surface of the glass substrate. The glass substrate was drilled over its entire surface by sand blasting, to form through-holes. For sand blasting, abrasive grains WA #1200 (Showa Denko K.K.) were blasted under a pneumatic pressure of 0.22 MPa.

At the end of sand blasting, the through-holes had a square opening of width 0.82 mm on the front surface of the substrate and a square opening of width 0.81 mm squares on the back surface of the substrate (w1:w2=1.0:1.0).

Another synthetic quartz glass substrate (diameter 101.6 mm, thickness 0.3 mm) having front and back surfaces which were mirror surfaces (Ra=0.13 nm) was joined to the first substrate having a plurality of through-holes, and held in an electric oven at 1,100° C. for 2 hours to bond two glass substrates together.

The glass substrate laminate was cut by a dicing saw at a position between through-holes into a plurality of pieces (synthetic quartz glass cavity members) of 1.2 mm squares.

Using a dispenser, a silicone resin adhesive (KER-3000-M2, Shin-Etsu Chemical Co., Ltd.) was coated to the lower end of the side wall of the cavity member to form a linear coating with a width of 250 μm and a thickness of 15 to 20 μm, obtaining a synthetic quartz glass cavity lid.

The cavity lid was rested on an alumina base ceramic substrate having a flame sensor mounted thereon, temporarily bonded thereto under a load of 150 gf per package, and heat bonded in a drying oven at 200° C. for 1 hour, completing a light-receiving flame sensor package.

The light-receiving flame sensor package was placed near a flame emitting light in the UV region. It was confirmed that the sensor operated well by catching light from the flame through the synthetic quartz glass while peeling of the adhesive layer by stresses of the glass cavity member or alumina base ceramic substrate was observed nowhere. The package showed a satisfactory function.

Example 2

A synthetic quartz glass wafer or substrate (diameter 152.4 mm, thickness 0.3 mm) having a front surface which was a mirror surface (Ra=0.25 nm) was furnished as the first substrate. Using a machining center, the glass substrate was drilled over its entire surface. The machining center was equipped with a diamond wheel, which was operated at a spindle speed of 20,000 rpm and a grinding rate of 50 mm/min. In this way, a plurality of through-holes were formed in the glass substrate. Both the openings on the front and back surfaces of the glass substrate had a diameter of 2.52 mm.

Another synthetic quartz glass substrate (diameter 152.4 mm, thickness 0.3 mm) having front and back surfaces which were mirror surfaces (Ra=0.13 nm) was joined to the first substrate having a plurality of through-holes, and held in an electric oven at 1,050° C. for 4 hours to bond two glass substrates together.

The (top wall-forming) unperforated glass substrate was polished on its outside surface (single-side lapping) until the top wall of the cavity member reached a thickness of 0.2 mm.

The glass substrate laminate was cut by a dicing saw at a position between through-holes into a plurality of pieces (synthetic quartz glass cavities) of 3.5 mm squares.

A metallic glass or alloy consisting of 30 wt % silver, 30 wt % tin, 25 wt % bismuth, and 15 wt % copper (glass transition temperature 300° C.) was coated on the lower end of the side wall of each cavity member by screen printing, to form a linear coating with a width of 240 μm and a thickness of 15 to 20 μm, and heated at 100° C. for 25 minutes, obtaining a synthetic quartz glass cavity lid having the B-staged metallic glass layer.

On a gold-plated aluminum nitride substrate, a UV-LED chip capable of emitting light of wavelength 285 nm was mounted. The cavity lid was bonded to the substrate while heating at 250° C. for 10 minutes and applying a load of 1 kgf per package, such that the chip was accommodated in the cavity member, completing an optical device package.

The UV-LED chip was activated to emit light of wavelength 285 nm over 5,000 hours. Peeling of the adhesive layer by stresses of the glass cavity member or aluminum nitride substrate was observed nowhere, and no damages to the adhesive layer by light of short wavelength 285 nm were observed. The short wavelength optical device package showed a satisfactory function.

Japanese Patent Application No. 2018-137374 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a synthetic quartz glass cavity member, comprising the steps of:
    drilling a first synthetic quartz glass substrate at a plurality of positions to form a plurality of through-holes,
    laying a second synthetic quartz glass substrate on the first synthetic quartz glass substrate to form a laminate, the second synthetic quartz glass substrate having a mirror surface which is opposed to the perforated synthetic quartz glass substrate, and
    cutting the laminate at a position between adjacent through-holes into a plurality of discrete synthetic quartz glass cavity members.

2. The method of claim 1, wherein the drilling step is sand blasting or grinding by a machining center.

3. A method for manufacturing a cavity lid, comprising the steps of:
    manufacturing a synthetic quartz glass cavity member by the method of claim 1, and
    applying a resin or metal-base paste to a lower end of a side wall of the cavity member to form a resin or metal-base adhesive layer.

4. The method of claim 3, wherein the adhesive layer is a metal-base adhesive layer, the method further comprising the step of heating the metal-base paste to form a B-staged metal-base adhesive layer.

5. A method for manufacturing an optical device package, comprising the steps of:
    manufacturing a cavity lid by the method of claim 3, and
    bonding the cavity lid at its adhesive layer to a substrate having a light-emitting or receiving device mounted thereon such that the device may be accommodated in the cavity member.

* * * * *